US012381086B2

(12) United States Patent
Wang et al.

(10) Patent No.: US 12,381,086 B2
(45) Date of Patent: Aug. 5, 2025

(54) LOW TEMPERATURE GRAPHENE GROWTH

(71) Applicant: Applied Materials, Inc., Santa Clara, CA (US)

(72) Inventors: Jialiang Wang, San Jose, CA (US); Susmit Singha Roy, Campbell, CA (US); Abhijit Basu Mallick, Fremont, CA (US); Nitin K. Ingle, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 245 days.

(21) Appl. No.: 17/974,859

(22) Filed: Oct. 27, 2022

(65) Prior Publication Data
US 2023/0056280 A1    Feb. 23, 2023

Related U.S. Application Data

(62) Division of application No. 17/142,626, filed on Jan. 6, 2021, now Pat. No. 11,515,163.

(51) Int. Cl.
*H01L 21/285* (2006.01)
*C01B 32/184* (2017.01)
(Continued)

(52) U.S. Cl.
CPC ...... *H01L 21/28556* (2013.01); *C01B 32/184* (2017.08); *C23C 16/26* (2013.01);
(Continued)

(58) Field of Classification Search
None
See application file for complete search history.

(56) References Cited

U.S. PATENT DOCUMENTS

| 11,515,163 | B2 | 11/2022 | Wang et al. |
| 2012/0261073 | A1* | 10/2012 | Yager ................... C23C 16/56 |
| | | | 156/345.23 |

(Continued)

FOREIGN PATENT DOCUMENTS

| JP | 2010212619 A | 9/2010 |
| KR | 20180026284 A | 3/2018 |

(Continued)

OTHER PUBLICATIONS

Application No. PCT/US2022/011061, International Search Report and Written Opinion, Mailed On Apr. 25, 2022, 9 pages.
KR10-2023-7026407, "Office Action", Jan. 31, 2025, 7 pages.

*Primary Examiner* — Katie L. Hammer
(74) *Attorney, Agent, or Firm* — Kilpatrick Townsend & Stockton LLP (57) ABSTRACT

Exemplary methods of semiconductor processing include delivering a carbon-containing precursor and a hydrogen-containing precursor to a processing region of a semiconductor processing chamber. A flowrate ratio of the hydrogen-containing precursor to the carbon-containing precursor may be maintained greater than or about 2:1. The methods include forming a layer of graphene on a substrate positioned within the processing region of the semiconductor processing chamber. The substrate may be maintained at a temperature below or about 600° C.

20 Claims, 6 Drawing Sheets

(51) Int. Cl.
  *C23C 16/26* (2006.01)
  *C23C 16/455* (2006.01)
  *H01L 21/02* (2006.01)
  *H01L 23/532* (2006.01)

(52) U.S. Cl.
  CPC .. *C23C 16/45536* (2013.01); *H01L 21/02104* (2013.01); *H01L 21/02115* (2013.01); *H01L 21/02491* (2013.01); *H01L 21/02494* (2013.01); *H01L 21/02527* (2013.01); *H01L 21/0262* (2013.01); *H01L 23/53276* (2013.01)

(56) References Cited

U.S. PATENT DOCUMENTS

| | | |
|---|---|---|
| 2014/0044885 A1 | 2/2014 | Boyd |
| 2015/0064098 A1* | 3/2015 | Grobert .................. B82Y 30/00 117/97 |
| 2015/0170943 A1 | 6/2015 | Nguyen et al. |
| 2017/0316935 A1 | 11/2017 | Tan et al. |
| 2019/0019690 A1 | 1/2019 | Choi et al. |
| 2020/0039827 A1 | 2/2020 | Jung et al. |
| 2020/0286732 A1 | 9/2020 | Shin et al. |
| 2020/0325574 A1 | 10/2020 | Tseng et al. |

FOREIGN PATENT DOCUMENTS

| | | |
|---|---|---|
| KR | 20180091729 A | 8/2018 |
| KR | 20200015279 A | 2/2020 |
| KR | 20200128975 A | 11/2020 |
| WO | 2021067118 A1 | 4/2021 |

\* cited by examiner

LOW TEMPERATURE GRAPHENE GROWTH

CROSS-REFERENCE TO RELATED APPLICATIONS

This application is a divisional of U.S. application Ser. No. 17/142,626, filed Jan. 6, 2021, which is hereby incorporated by reference in its entirety for all purposes.

TECHNICAL FIELD

The present technology relates to systems and methods for semiconductor manufacturing. More specifically, the present technology relates to semiconductor processing and equipment for forming graphene.

BACKGROUND

Integrated circuits are made possible by processes which produce intricately patterned material layers on substrate surfaces. Producing patterned material on a substrate requires controlled methods for forming and removing material. Precursors are often delivered to a processing region and distributed to uniformly deposit or etch material on the substrate. As device sizes continue to shrink, material uniformity may affect subsequent operations as well as device quality. For example, as layers of material are reduced in thickness, the coverage of the layer may be affected, and voids or gaps in coverage may occur.

Thus, there is a need for improved systems and methods that can be used to produce high quality devices and structures. These and other needs are addressed by the present technology.

SUMMARY

Exemplary methods of semiconductor processing may include delivering a carbon-containing precursor and a hydrogen-containing precursor to a processing region of a semiconductor processing chamber. The methods may include generating a plasma of the carbon-containing precursor and the hydrogen-containing precursor within the processing region of the semiconductor processing chamber. The methods may include forming a layer of graphene on a substrate positioned within the processing region of the semiconductor processing chamber. The substrate may be maintained at a temperature below or about 600° C. The methods may include halting flow of the carbon-containing precursor while maintaining the plasma with the hydrogen-containing precursor.

In some embodiments, a flowrate ratio of the hydrogen-containing precursor to the carbon-containing precursor may be maintained greater than or about 2:1. The plasma may be or include a capacitively-coupled plasma. A processing chamber pressure may be maintained above or about 3 Torr. The methods may include, subsequent a period of time after halting flow of the carbon-containing precursor, re-starting flow of the carbon-containing precursor. The methods may include forming an additional layer of graphene on the substrate. The substrate may be or include a metal or a dielectric material. A plasma power may be maintained below or about 1000 W during generation of the plasma. The methods may include, subsequent halting flow of the carbon-containing precursor, etching the layer of graphene formed on the substrate with plasma effluents of the hydrogen-containing precursor. The carbon-containing precursor may be or include a hydrocarbon.

Some embodiments of the present technology may encompass methods of semiconductor processing. The methods may include delivering a carbon-containing precursor and a hydrogen-containing precursor to a processing region of a semiconductor processing chamber. A flowrate ratio of the hydrogen-containing precursor to the carbon-containing precursor may be maintained greater than or about 2:1. The methods may include forming a layer of graphene on a substrate positioned within the processing region of the semiconductor processing chamber. The substrate may be maintained at a temperature below or about 600° C.

In some embodiments, The processing region may be maintained plasma free while forming the layer of graphene on the substrate. The substrate may be or include cobalt. A flowrate of the carbon-containing precursor may be maintained below or about 100 sccm. A pressure within the processing region of the semiconductor processing chamber may be maintained below or about 10 Torr. The carbon-containing precursor may be or include a hydrocarbon.

Some embodiments of the present technology may encompass methods of semiconductor processing. The methods may include delivering a carbon-containing precursor and a hydrogen-containing precursor to a processing region of a semiconductor processing chamber. A flowrate ratio of the carbon-containing precursor to the hydrogen-containing precursor may be maintained greater than or about 1:1. The methods may include forming a layer of graphene on a substrate positioned within the processing region of the semiconductor processing chamber. The substrate may be maintained at a temperature below or about 400° C. The processing region may be maintained plasma free while forming the layer of graphene on the substrate. The substrate may be or include cobalt. A flowrate of the carbon-containing precursor may be maintained greater than or about 1000 sccm. A pressure within the processing region of the semiconductor processing chamber may be maintained greater than or about 10 Torr.

Such technology may provide numerous benefits over conventional systems and techniques. For example, embodiments of the present technology may produce layers of graphene at reduced temperatures with and without plasma enhancement. Additionally, the methods may afford reduced thickness layers for barrier coverage. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

In semiconductor device processing, a number of materials are used to develop any number of structures and devices. When metals and conductive materials are incorporated, one or more barrier layers may be formed to limit migration into surrounding materials, which can lead to shorting and device damage. As one non-limiting example, for back-end-of-line logic processing, conductive materials may include copper and cobalt. Electromigration barriers used for these materials may include tantalum nitride and titanium nitride, respectively. Although these nitrides are often formed conformally with atomic-layer deposition, due to the columnar structure of the nitrides, the materials may require a certain thickness of deposition to ensure complete coverage of surrounding dielectric materials. Typically, these materials require more than 25 Å thickness to ensure coverage.

As device sizes continue to shrink, many material layers may be reduced in thickness and size. Because future nodes may be characterized with similar resistivity requirements, reducing the amount of metal or conductive material may be avoided more than other materials. However, a bottleneck may be created by limitations in liner and barrier layer thickness as noted above. To address this issue, many conventional technologies may be constrained in the amount of reduction with these materials, and may be forced to increase reductions in dielectrics and device spacing, which can increased crosstalk and electrical issues.

The present technology may overcome these issues by forming liners of graphene. The nature of growth for graphene may be more lateral, which may produce layers of coverage characterized by a reduced thickness compared to conventional materials. However, use of graphene in logic devices is challenged based on the high-temperatures typically needed to sufficiently grow graphene with a dehydrogenation operation. Additionally, growth is often limited to metals, which may catalyze dehydrogenation. The present technology overcomes these challenges in multiple ways. For example, by forming a less restrained layer of graphene, lower temperatures may be used to form the graphene. Additionally, plasma enhancement may be used to facilitate breakdown proximate the substrate. This may advantageously allow formation not only on metals, but also on dielectric materials, which may otherwise be incapable of supporting graphene growth due to the thermal budget of the dielectric material.

Although the remaining disclosure will routinely identify specific deposition processes utilizing the disclosed technology, it will be readily understood that the systems and methods are equally applicable to other deposition processes, as well as processes as may occur in the described chambers. Accordingly, the technology should not be considered to be so limited as for use with these specific deposition processes or chambers alone. The disclosure will discuss one possible system and chamber that may include components according to some embodiments of the present technology before processes and parameters according to embodiments of the present technology are described.

Figure 1:
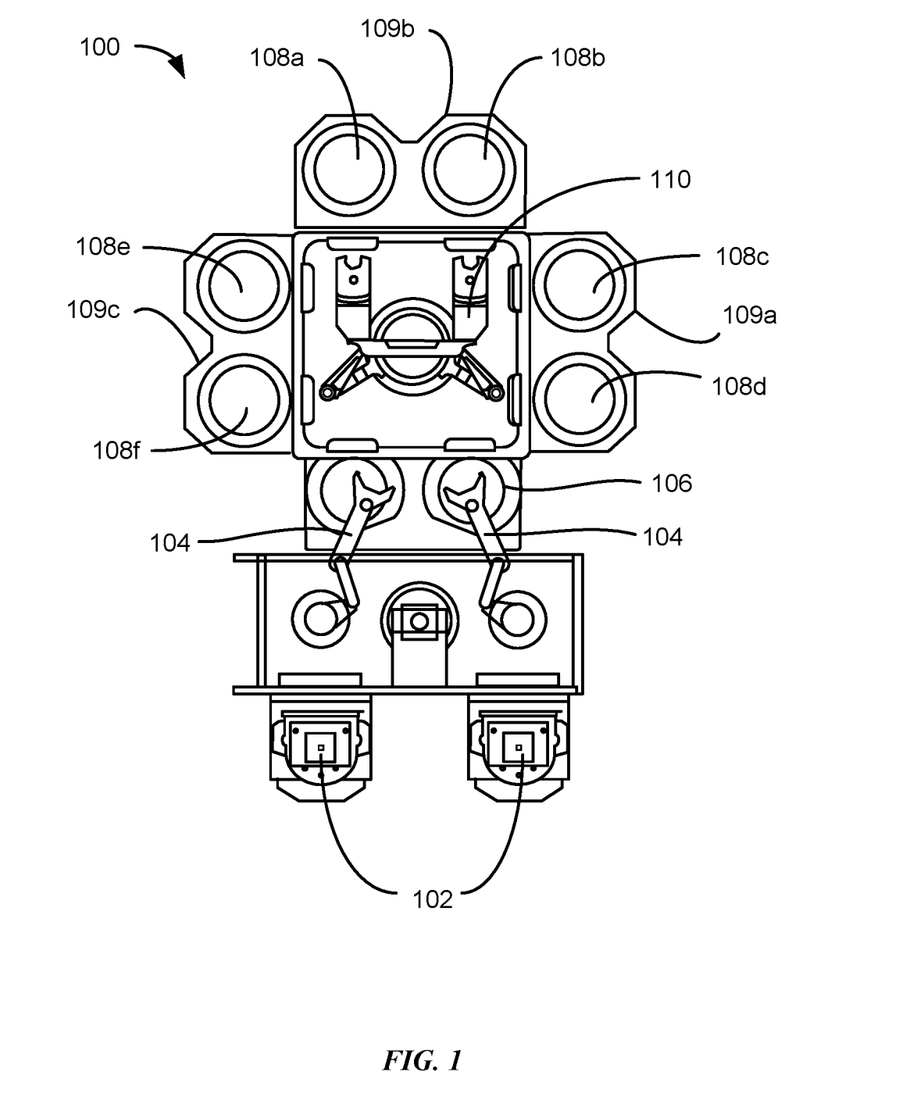
FIG. 1 shows a top plan view of an exemplary processing system according to some embodiments of the present technology.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108a-f may include one or more system components for depositing, annealing, curing and/or etching a dielectric or other film on the substrate. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
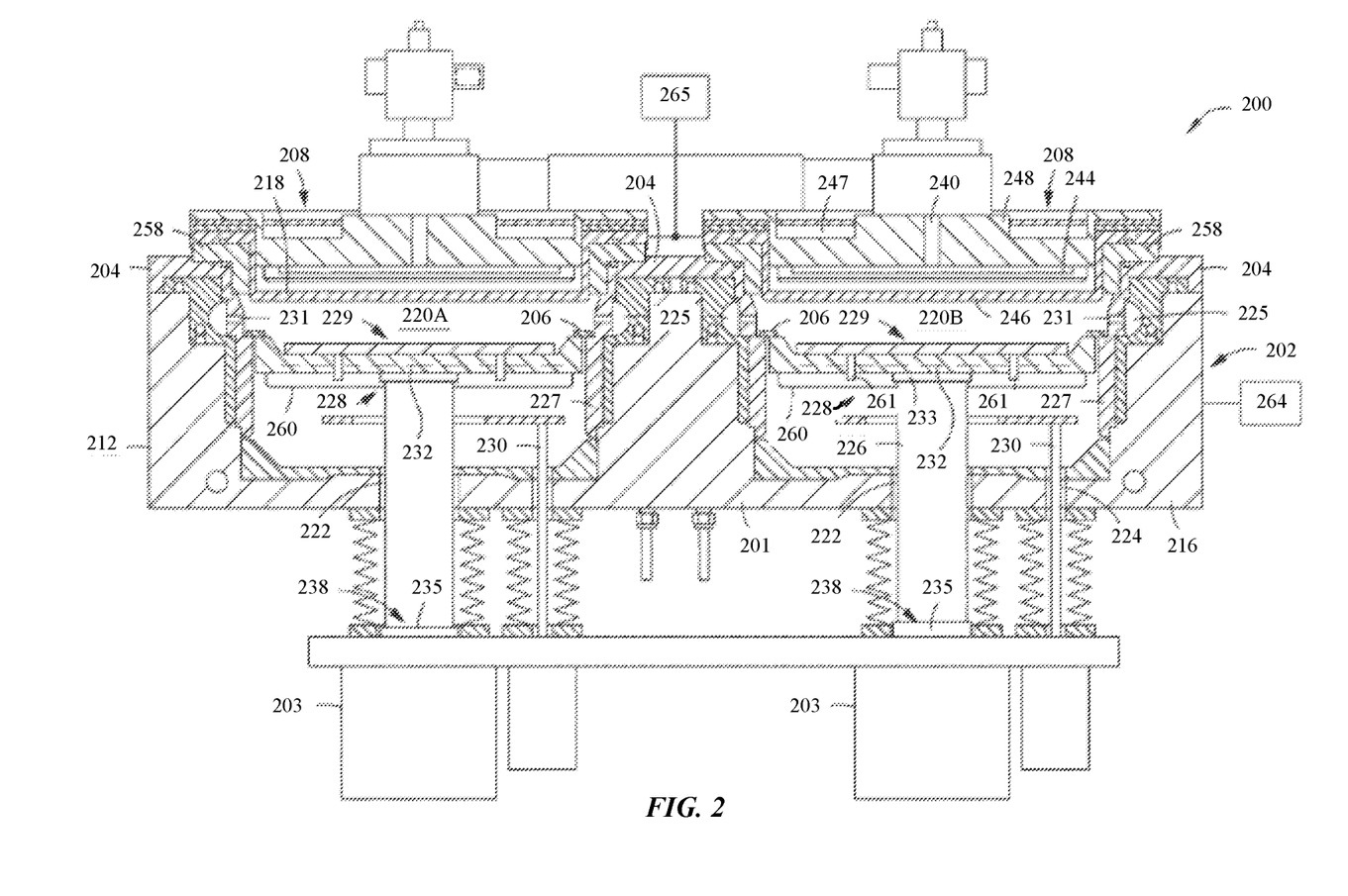
FIG. 2 shows a schematic cross-sectional view of an exemplary plasma system according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include faceplates or other components or assemblies according to embodiments of the present technology. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a gas delivery assembly 218 into the processing region 220B. The gas delivery assembly 218 may include a gasbox 248 having a blocker plate 244 disposed intermediate to a faceplate 246. A radio frequency ("RF") source 265 may be coupled with the gas delivery assembly 218, which may power the gas delivery assembly 218 to facilitate generating a plasma region between the faceplate 246 of the gas delivery assembly 218 and the pedestal 228, which may be the processing region of the chamber. In some embodiments, the RF source may be coupled with other portions of the chamber body 202, such as the pedestal 228, to facilitate plasma generation. A dielectric isolator 258 may be disposed between the lid 204 and the gas delivery assembly 218 to prevent conducting RF power to the lid 204. A shadow ring 206 may be disposed on the periphery of the pedestal 228 that engages the pedestal 228.

An optional cooling channel 247 may be formed in the gasbox 248 of the gas distribution system 208 to cool the gasbox 248 during operation. A heat transfer fluid, such as water, ethylene glycol, a gas, or the like, may be circulated through the cooling channel 247 such that the gasbox 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3:
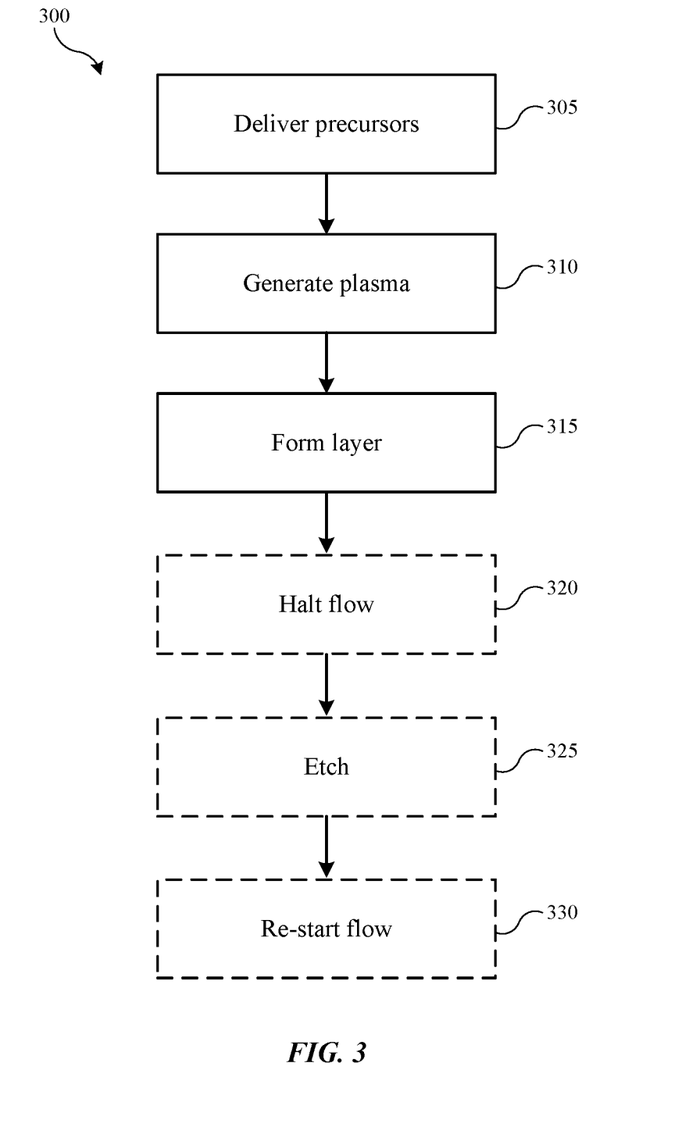
FIG. 3 shows operations of an exemplary method of semiconductor processing according to some embodiments of the present technology.

The chamber discussed previously may be used in performing exemplary methods including deposition or formation methods. Turning to FIG. 3 is shown operations of an exemplary method 300 of semiconductor processing according to some embodiments of the present technology. The method may be performed in a variety of processing chambers, including processing system 200 described above, which may include any features or components as previously described. Method 300 may include a number of optional operations, which may or may not be specifically associated with some embodiments of methods according to the present technology. For example, many of the operations are described in order to provide a broader scope of the technology, but are not critical to the technology, or may be performed by alternative methodology as would be readily appreciated. Method 300 may describe operations shown schematically in FIGS. 4A-4D, as well as FIGS. 5A-5D, the illustrations of which will be described in conjunction with the operations of method 300. It is to be understood that the figures illustrate only partial schematic views, and a substrate may contain any number of additional materials and features having a variety of characteristics and aspects as illustrated in the figures.

Figure 4A:
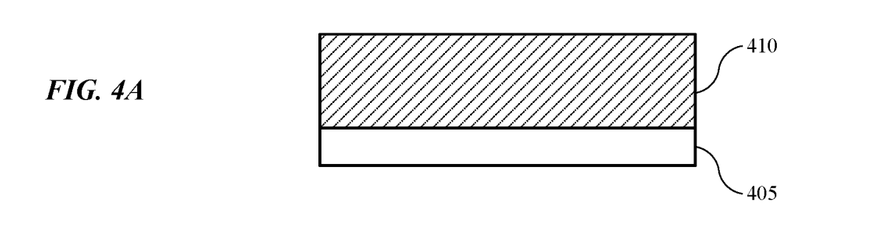
FIGS. 4A-4D show schematic cross-sectional views of semiconductor processing according to some embodiments of the present technology.

Method 300 may include additional operations prior to initiation of the listed operations. For example, semiconductor processing may be performed prior to initiating method 300 in order to develop the semiconductor structure to a particular fabrication operation. Processing operations may be performed in the chamber or system in which method 300 may be performed, or processing may be performed in separate chambers on the same mainframe or a different system from which method 300 may be performed. It is to be understood that method 300 may be performed on any number of semiconductor structures or substrates 405, as illustrated in FIG. 4A, including exemplary structures on which a graphene formation operation may be performed. The substrate on which processing may occur may be a material such as crystalline silicon, silicon oxide, strained silicon, silicon germanium, doped or undoped polysilicon, doped or undoped silicon wafers, patterned or non-patterned wafers, silicon on insulator, carbon doped silicon oxides, silicon nitride, doped silicon, germanium, gallium arsenide, sapphire, or any other substrate on which processing may be performed. The substrate may have various dimensions, such as 200 mm or 300 mm diameter wafers, as well as rectangular or square panels.

Figure 4B:
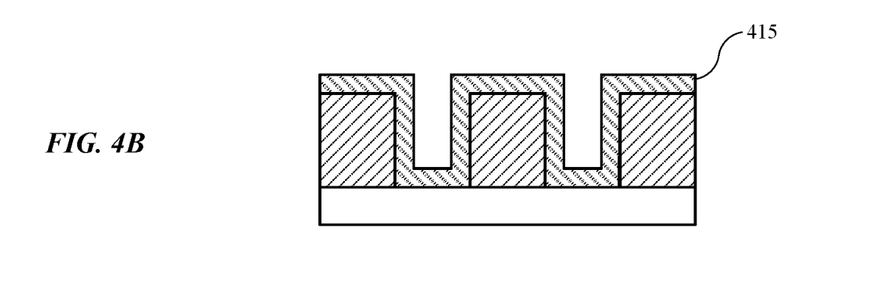

As one non-limiting example encompassed by the present technology in which graphene may be deposited for a logic structure, a dielectric material 410 may be formed overlying the substrate 405. The dielectric material may be a low-k dielectric or any other inter-layer material used in processing. As shown in FIG. 4B, features may be etched in the dielectric material 410. Method 300 may then form a graphene material layer 415 conformally across the patterned dielectric material.

As explained previously, graphene formation on dielectric materials may be frustrated by thermal budget constraints of the dielectric material. However, the present technology may overcome this issue by forming a local plasma to facilitate breakdown at lower substrate temperatures. Accordingly, some embodiments of the present technology may form graphene at substrate temperatures less than or about 600° C., and may form graphene at substrate temperatures less than or about 580° C., less than or about 560° C., less than or about 540° C., less than or about 520° C., less than or about 500° C., less than or about 480° C., less than or about 460° C., less than or about 440° C., less than or about 420° C., less than or about 400° C., less than or about 380° C., or less.

Figure 4C:
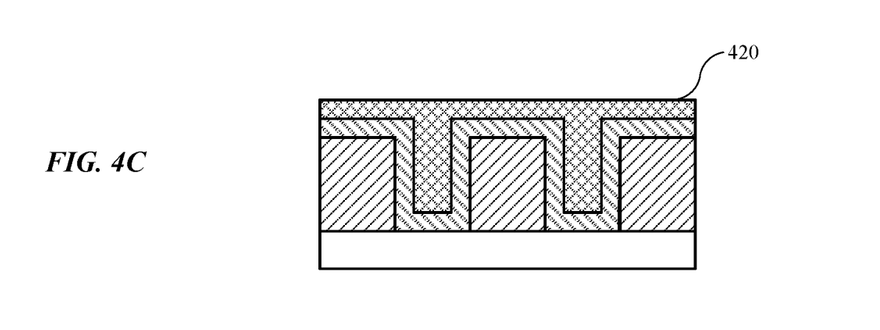
Figure 4D:
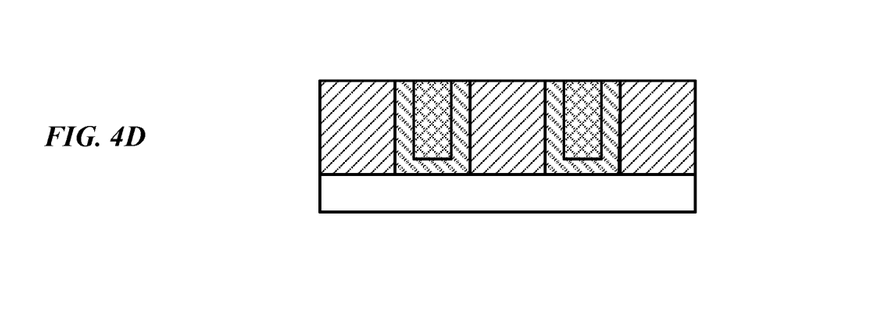

After the substrate has been processed and/or positioned within the processing region, method 300 may deliver one or more precursors to the substrate processing region at operation 305. In some embodiments, the precursors may include a carbon-containing precursor and a hydrogen-containing precursor. The carbon-containing precursor may be any number of precursors including carbon. For example, the carbon-containing precursor may be or include a hydrocarbon, including any alkane, alkene, alkyne, or aromatic material, which as non-limiting examples may include ethane, ethene, propane, propene, acetylene, or any higher-order hydrocarbon, or the precursor may be a material including one or more of carbon, hydrogen, oxygen, or nitrogen. The hydrogen-containing precursor may include any hydrogen-containing material, and in some embodiments may be diatomic hydrogen. In any of the formation operations one or more additional precursors or carrier gases may be included, such as inert precursors, which may include Ar, He, Xe, Kr, nitrogen, or other precursors. A plasma may be generated from the precursors at operation 310, and a layer of graphene may be formed at operation 315, as illustrated by layer 415 shown in FIG. 4B. Once a sufficient amount of graphene has been formed, the process may be halted. As shown in FIG. 4C, a metal or conductive material 420 may be formed within the lined trenches. The conductive material may include any metals, such as copper or cobalt, or any other conductive materials that may be used in semiconductor processing. Planarization may occur to produce a final structure as illustrated in FIG. 4D.

The flowrate of the carbon-containing precursor may control growth rate, but may also impact the development of $sp^2$ bonding along with the incorporation of hydrogen. For example, as carbon flowrate is increased, film growth may increase along with $sp^2$ bonding, $sp^a$ bonding, and hydrogen bonding within the film. Accordingly, in some embodiments a flowrate of the carbon-containing precursor may be maintained at less than or about 2000 sccm, and may be maintained at less than or about 1500 sccm, less than or about 1000 sccm, less than or about 500 sccm, less than or about 400 sccm, less than or about 300 sccm, less than or about 200 sccm, less than or about 100 sccm, less than or about 75 sccm, less than or about 50 sccm, less than or about 25 sccm, less than or about 10 sccm, or less.

The use of additional hydrogen within plasma precursors may facilitate removal of $sp^a$ bonding and hydrogen bonding, which may be characterized by weaker bond strength. Accordingly, in some embodiments a flowrate of the hydrogen-containing precursor may be maintained at greater than or about 50 sccm, and may be maintained at greater than or about 100 sccm, greater than or about 200 sccm, greater than or about 300 sccm, greater than or about 400 sccm, greater than or about 500 sccm, greater than or about 600 sccm, greater than or about 700 sccm, greater than or about 800 sccm, greater than or about 900 sccm, greater than or about 1000 sccm, or higher. However, as hydrogen incorporation increases, growth may eventually be suppressed completely. Accordingly, balancing a flowrate ratio between the carbon-containing precursor and the hydrogen-containing precursor may facilitate growth of $sp^2$-bonded carbon, while suppressing other carbon growth. Thus, in some embodiments, a flowrate ratio of the hydrogen-containing precursor to the carbon-containing precursor may be maintained greater than or about 2:1, and may be maintained greater than or about 5:1, greater than or about 10:1, or more.

In a plasma environment, controlling a balance between the hydrogen and carbon may be challenged compared to a thermal environment as will be discussed further below. Accordingly, in some embodiments method 300 may include additional operations to facilitate controlled growth of graphene on the substrate. For example, after sufficient growth of a layer of graphene has occurred, method 300 may include halting the flow of the carbon-containing precursor at optional operation 320. This may halt growth of the film. Additionally, the flow of the hydrogen-containing precursor may be maintained and the plasma generation may be continued, which may facilitate etching of the formed graphene at optional operation 325, which may allow the removal of $sp^a$-bonded carbon and hydrogen bonding. After a period of time during which etching may occur, such as less than or about 5 minutes, less than or about 4 minutes, less than or about 3 minutes, less than or about 2 minutes, less than or about 1 minute, less than or about 45 seconds, less than or about 30 seconds, less than or about 15 seconds, or less, a flow of the carbon-containing precursor may be re-started at optional operation 330. This may allow an additional layer of graphene to be formed on the substrate. Accordingly, by pulsing the carbon-containing precursor, while maintaining hydrogen-containing precursor flow and plasma generation, a number of layers of graphene may be formed.

Method 300 may cause defects to be formed in the layers of graphene formed in some embodiments of the present technology, and thus in some embodiments multiple layers of graphene may be formed to complete coverage. Although any number of layers of graphene may be formed in embodiments of the present technology, including dozens or more, the present technology may produce a sufficient barrier layer with less than or about 50 layers of graphene in some embodiments, and may produce a sufficient barrier layer with less than or about 40 layers, less than or about 30 layers, less than or about 20 layers, less than or about 10 layers, less than or about 8 layers, less than or about 6 layers, less than or about 5 layers, less than or about 4 layers, less than or about 3 layers, or less. This may afford a barrier characterized by a layer thickness of less than or about 25 Å, and which may be characterized by a thickness of less than or about 20 Å, less than or about 15 Å, less than or about 10 Å, or less.

To facilitate controlled growth at low flowrates, and to minimize additional heating caused by plasma formation, in some embodiments the plasma may be a locally-formed, capacitively-coupled plasma as discussed previously. The plasma power may be reduced to control dissociation and dehydrogenation of the carbon-containing precursor, and thus the plasma power may be maintained at less than or about 1000 W, and may be maintained at less than or about 800 W, less than or about 600 W, less than or about 400 W, or less. Lower plasma powers may ensure improved growth by reducing defect generation from bombardment and increased hydrogen radical formation. Similarly, reduced plasma power during the etching operation may improve etching of weaker bonded species, while limiting removal of $sp^2$-bonded carbon. Additionally, by utilizing a capacitively-coupled plasma, a higher pressure within the substrate processing region may be used compared to other forms of plasma generation, such as inductively-coupled plasma.

Accordingly, in some embodiments of the present technology, a pressure within the processing region may be maintained at greater than or about 1 Torr, and may be maintained at greater than or about 3 Torr, greater than or about 5 Torr, or higher, during plasma generation.

Figure 5A:
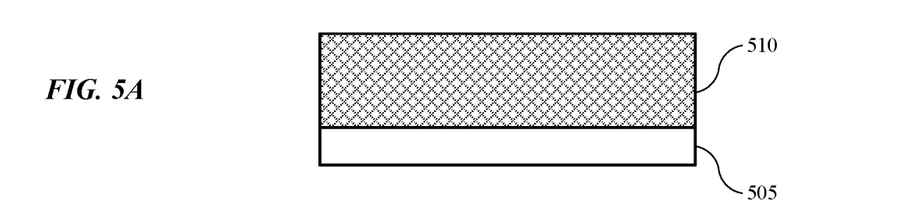
FIGS. 5A-5D show schematic cross-sectional views of semiconductor processing according to some embodiments of the present technology.
Figure 5B:
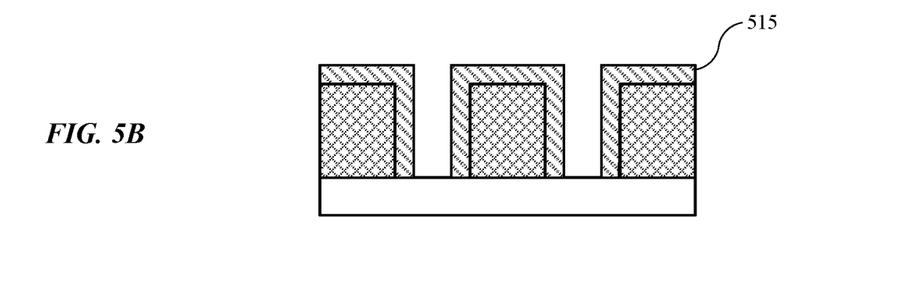
Figure 5C:
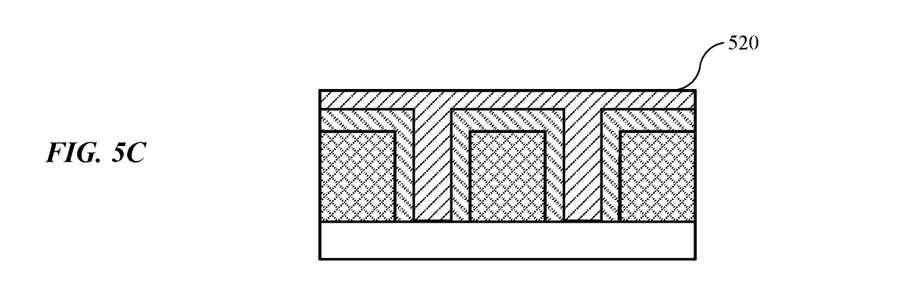
Figure 5D:
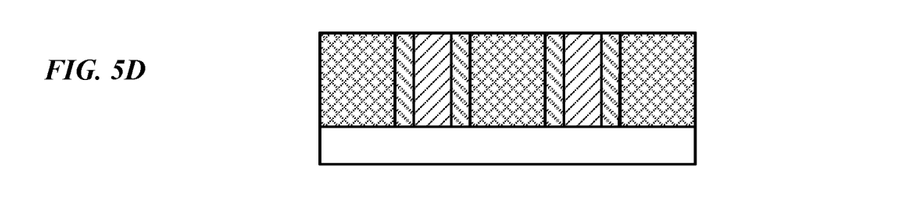

By utilizing a plasma generation, formation may occur on a dielectric material, such as silicon oxide, or other dielectrics, as described with respect to the process flow illustrated in FIG. 4A-4D. However, additional process flows may also be supported in embodiments of the present technology, including formation on metal. For example, as illustrated in FIGS. 5A-5D, a reverse patterning may be performed in some embodiments, and which may include any of the materials or processes as previously discussed. As shown in FIG. 5A, a metal or conductive material 510 may be formed overlying a substrate 505. Conductive material may be a metal, such as copper or cobalt, or any other material that may be used in semiconductor processing. The conductive material may be etched and a barrier layer 515 may be formed about the conductive material sections as illustrated in FIG. 5B. The barrier layer may be or include graphene formed as discussed above, or may include thermally grown graphene as will be described below. A dielectric material 520 may be deposited about the structure as shown in FIG. 5C, and may be performed as a gap fill operation, such as utilizing flowable or other low-k dielectric materials. A planarization may be performed to produce the structure as shown in FIG. 5D. Consequently, embodiments of the present technology may form graphene layers over a number of materials, including both metal and dielectric materials.

Figure 6:
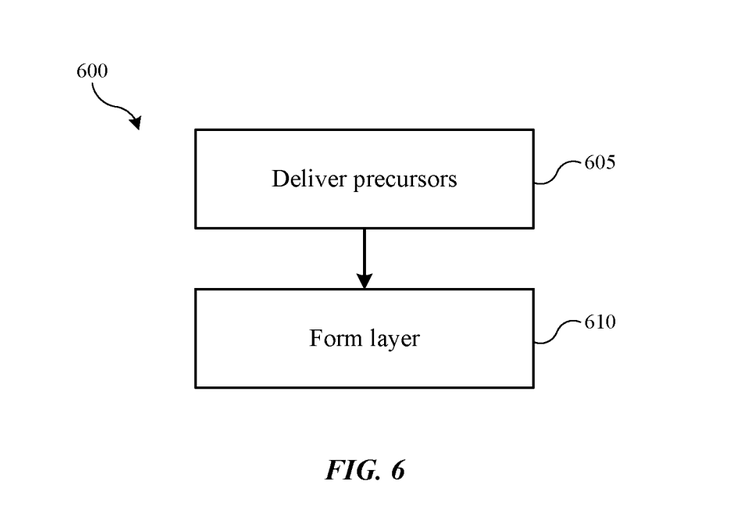
FIG. 6 shows operations of an exemplary method of semiconductor processing according to some embodiments of the present technology.

By utilizing process flows that may allow formation of the graphene layers on metal, some embodiments of the present technology may afford graphene deposition at low substrate temperatures, which may also be performed in a plasma-free environment. FIG. 6 shows operations of an exemplary method 600 of semiconductor processing according to some embodiments of the present technology. The method may be performed in a variety of processing chambers, including processing system 200 described above, and may include any material, operation, or process characteristic described previously with respect to method 300 or elsewhere. Method 600 may illustrate operations for developing a graphene layer without plasma enhancement, such as on a metal substrate. Method 600 may include delivering a carbon-containing precursor and a hydrogen-containing precursor at operation 605, and forming a layer of graphene on a substrate at operation 610. The precursors may include any material discussed previously, as well as any process characteristic as previously described. For example, the processes may be performed at substrate temperatures below or about 600° C., or lower, as discussed above. In some embodiments the thermal growth may be performed on a metal substrate, as graphene growth may be challenged at temperatures below 700° C. The metal may catalyze dehydrogenation in some embodiments, which may facilitate formation of graphene at temperatures according to embodiments of the present technology.

Additionally, because the process may be a plasma-free formation, a flowrate ratio between the hydrogen-containing precursor and the carbon-containing precursor may be utilized to better control growth of the graphene layer. For example, flowrate adjustments may be performed to produce a low flux or a high flux type of graphene growth in some embodiments. For example, a lower defect graphene may be formed with a low flux flow, where the flowrate ratio between the hydrogen-containing precursor and the carbon-containing precursor may be maintained at greater than or about 2:1, greater than or about 5:1, greater than or about 10:1, greater than or about 15:1, greater than or about 20:1, or higher. However, as the amount of hydrogen increases, growth suppression may increase until the film fails to form. Accordingly, in some embodiments the flowrate ratio may be maintained at less than or about 30:1, less than or about 25:1, less than or about 20:1, or less, when the flowrate of the carbon-containing precursor is maintained at a lower rate as previously described, including at less than or about 100 sccm, for example. Additionally, when lower rates of carbon-containing precursor may be used, a pressure within the processing chamber may be reduced, which may further facilitate formation of lower defect graphene. For example, the pressure may be maintained at less than or about 10 Torr, and may be maintained at less than or about 5 Torr, less than or about 3 Torr, less than or about 1 Torr, less than or about 0.5 Torr, less than or about 0.25 Torr, or less.

Some embodiments of the present technology may also encompass a high flux growth of graphene, which may form an increased amount of smaller-sized, lamellar sheets of graphene that may build up along a structure to form a contiguous layer. Because increased flowrates are utilized to produce less controlled sheets based on a diffusion process, the process may be pressure independent, and may be performed at processing pressures of greater than or about 10 Torr, greater than or about 50 Torr, greater than or about 100 Torr, greater than or about 200 Torr, greater than or about 300 Torr, or higher. Additionally, to limit removal of material due to hydrogen flow, a flowrate ratio of the carbon-containing precursor to the hydrogen-containing precursor may be maintained at greater than or about 1:1, and may be maintained at greater than or about 5:4, greater than or about 4:3, greater than or about 3:2, greater than or about 2:1, or higher.

To facilitate the growth, a flowrate of the carbon-containing precursor may be maintained at greater than or about 500 sccm, and may be maintained at greater than or about 750 sccm, greater than or about 1000 sccm, greater than or about 1250 sccm, greater than or about 1500 sccm, or higher. A metal substrate or material on which the growth may occur may catalyze the dehydrogenation of the material, and may become saturated with carbon, which may then precipitate out as lamellar layers of material. The increased flowrate may ensure saturation of the metal is exceeded, which may allow the substrate temperature to be further reduced, such as to a temperature less than or about 500° C., less than or about 475° C., less than or about 450° C., less than or about 425° C., less than or about 400° C., less than or about 375° C., or less. By performing operations according to one or more embodiments of the present technology, controlled growth of graphene layers may be performed at reduced substrate temperatures. This may allow thinner barrier layers to be produced on a wider range of substrates.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the material" includes reference to one or more materials and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A method of semiconductor processing, comprising:
   delivering a carbon-containing precursor and a hydrogen-containing precursor to a processing region of a semiconductor processing chamber, wherein a flowrate ratio of the hydrogen-containing precursor to the carbon-containing precursor is maintained greater than or about 2:1; and
   forming a layer of graphene on a substrate characterized by a diameter of 200 mm or 300 mm positioned within the processing region of the semiconductor processing chamber, wherein the substrate is maintained at a temperature below or about 600° C.

2. The method of semiconductor processing of claim 1, wherein the processing region is maintained plasma free while forming the layer of graphene on the substrate.

3. The method of semiconductor processing of claim 1, wherein the substrate comprises cobalt.

4. The method of semiconductor processing of claim 1, wherein a flowrate of the carbon-containing precursor is maintained below or about 100 sccm.

5. The method of semiconductor processing of claim 1, wherein a pressure within the processing region of the semiconductor processing chamber is maintained below or about 10 Torr.

6. The method of semiconductor processing of claim 1, wherein the carbon-containing precursor comprises a hydrocarbon.

7. A method of semiconductor processing, comprising:
   delivering a carbon-containing precursor and a hydrogen-containing precursor to a processing region of a semiconductor processing chamber, wherein a flowrate ratio of the carbon-containing precursor to the hydrogen-containing precursor is maintained greater than or about 1:1; and
   forming a layer of graphene on a substrate characterized by a diameter of 200 mm or 300 mm positioned within the processing region of the semiconductor processing chamber, wherein the substrate is a metal substrate, and wherein the substrate is maintained at a temperature below or about 400° C.

8. The method of semiconductor processing of claim 7, wherein the processing region is maintained plasma free while forming the layer of graphene on the substrate.

9. The method of semiconductor processing of claim 7, wherein the substrate comprises cobalt.

10. The method of semiconductor processing of claim 7, wherein a flowrate of the carbon-containing precursor is maintained greater than or about 1000 sccm.

11. The method of semiconductor processing of claim 7, wherein a pressure within the processing region of the semiconductor processing chamber is maintained greater than or about 10 Torr.

12. A method of semiconductor processing, comprising:
    delivering a carbon-containing precursor and a hydrogen-containing precursor to a processing region of a semiconductor processing chamber, wherein a flowrate ratio of the hydrogen-containing precursor to the carbon-containing precursor is maintained greater than or about 1:1, wherein a flowrate of the carbon-containing precursor is maintained greater than or about 500 sccm; and
    forming a layer of graphene on a substrate positioned within the processing region of the semiconductor processing chamber, wherein the processing region is maintained plasma free while forming the layer of graphene on the substrate.

13. The method of semiconductor processing of claim 12, wherein the substrate is maintained at a temperature below or about 600° C.

14. The method of semiconductor processing of claim 12, wherein the flowrate ratio of the carbon-containing precursor to the hydrogen-containing precursor is maintained greater than or about 2:1.

15. The method of semiconductor processing of claim 12, wherein the substrate comprises a metal or dielectric material.

16. The method of semiconductor processing of claim 12, wherein the carbon-containing precursor comprises a hydrocarbon.

17. The method of semiconductor processing of claim 12, wherein the carbon-containing precursor comprises ethane, ethene, propane, propene, or acetylene.

18. The method of semiconductor processing of claim 12, wherein a flowrate of the carbon-containing precursor is maintained greater than or about 1500 sccm.

19. The method of semiconductor processing of claim 12, wherein the flowrate ratio of the carbon-containing precursor to the hydrogen-containing precursor is maintained less than or about 30:1.

20. The method of semiconductor processing of claim 19, wherein a pressure within the processing region of the semiconductor processing chamber is maintained below or about 10 Torr.

* * * * *